United States Patent [19]

Hale

[11] 4,032,795

[45] June 28, 1977

[54] INPUT BUFFER

[75] Inventor: Robert R. Hale, Rancho Santa Fe, Calif.

[73] Assignee: Solitron Devices, Inc., Tappan, N.Y.

[22] Filed: Apr. 14, 1976

[21] Appl. No.: 676,722

[52] U.S. Cl. .............................. 307/205; 307/208; 307/214; 307/241; 307/264; 307/270; 307/DIG. 1; H03K/17/60
[51] Int. Cl.² .................. H03K 19/08; H03K 19/40
[58] Field of Search .......... 307/205, 208, 214, 239, 307/240, 241, 242, 251, 264, 268, 270, 304, DIG. 1

[56] References Cited

UNITED STATES PATENTS

| | | | |
|---|---|---|---|
| 3,252,011 | 5/1966 | Zuk | 307/205 X |
| 3,395,290 | 7/1968 | Farina et al. | 307/205 X |
| 3,769,523 | 10/1973 | Suzuki | 307/251 X |

Primary Examiner—John S. Heyman
Assistant Examiner—Larry N. Anagnos
Attorney, Agent, or Firm—Richard G. Geib

[57] ABSTRACT

A circuit of complementary field effect devices whose logical input threshold voltage can be varied between levels suitable for TTL logic or CMOS or PMOS or other logic under control of an electrical signal in real time.

7 Claims, 4 Drawing Figures

INPUT BUFFER

BACKGROUND

Present day manufacturers of logic circuit have to work with numbers of discrete components or complicated integration of their function to create devices suitable for selectable direct interface to either TTL or CMOS logic in operation of MOS and TTL circuit elements.

Acutally the prior art requires components external to such IC devices, i.e. resistors, transistors and is some cases diodes. Other examples of known prior art are devices which are designed so as to have transistors of variable threshold as would be required in considering TTL mode and/or CMOS mode capability. However, with such devices it is not possible to control the circuit threshold independently of signal input especially if in a system where free time for conditioning the buffer is not available.

Other known circuits show two terminal devices intended to produce negative resistance. In such the applied bias signal will be some fraction of the applied signal voltage.

Also known are circuits which operate with bipolar devices, circuits using more than one substrate region being maintained at more than one voltage, and circuits to control electrical power displays.

SUMMARY

It is, therefore, a principal object of this invention to provide in answer to a problem of the prior art, a circuit that achieves changes in circuit threshold without altering device parameters, and one that is operable by an independent control input.

It is also an object of this invention to provide a circuit having an ability to produce a change in its transfer characteristics independently of applied signal voltage.

Another object of this invention is to provide such a circuit with unipolar devices, operable on one or more supply voltages to be a signal processing circuit for control of an output voltage as a function of input voltages at negligible current levels when such is desired.

DRAWING DESCRIPTION

DETAILED DESCRIPTION

Figure 1:
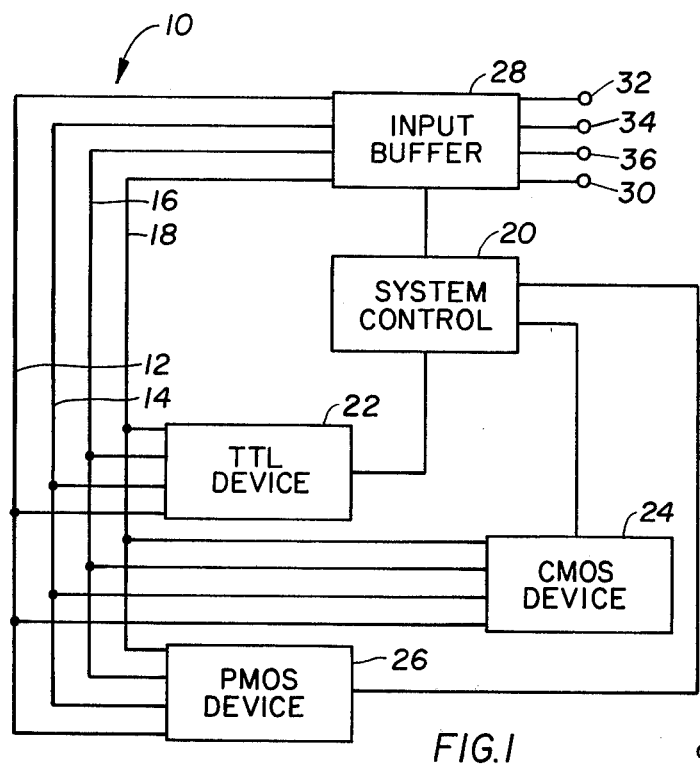
FIG. 1 is a block diagram of how this invention can be applied in systems of mixed TTL, PMOS and CMOS where all devices drive a data bus and low power consumption in standby is required.

With more particular reference to FIG. 1 there is shown thereby a data bus 10 to which are commonly connected on data lines 12, 14, 16 and 18, TTL device 22, CMOS device 24 and PMOS 26. Control 20 controls the circuitry 28 also connected to the bus 10 having output connections 30, 32, 34 and 36.

Figure 2:
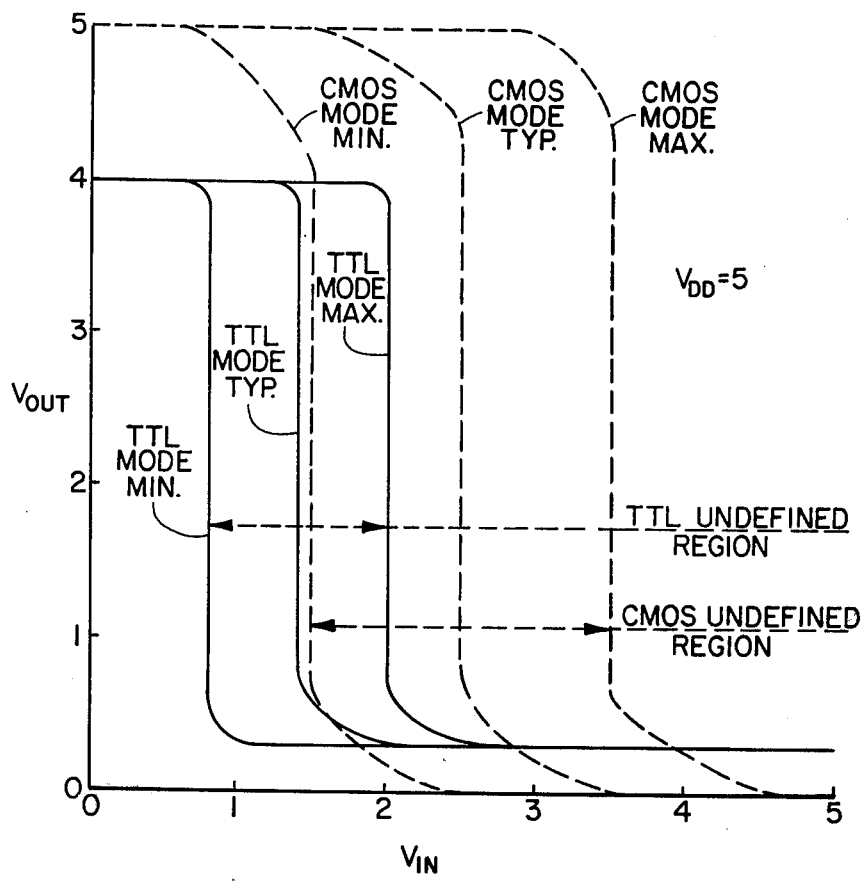
FIG. 2 is a graphical illustration of some of the sets of the voltage transfer characteristics possible with this invention.

As may be appreciated by one skilled in the art the threshold voltage for TTL devices can vary from 0.8V to 2.0V, whereas the threshold may be ⅓ to ⅔ of supply votage $V_{DD}$ for CMOS devices. This is clearly shown in a 5 volt $V_{DD}$ power supply circuit by FIG. 2.

Figure 3:
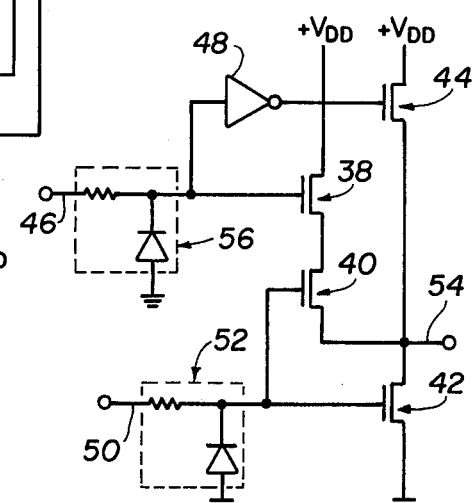
FIG. 3 is a schematic illustration of the circuit of unipolar devices in accordance with this invention.

As for the structure of this invention which allows for control of circuit threshold via an independent control input whereby one can experience a transfer characteristic change independently of applied signal voltage. attention is directed to FIG. 3. There it is shown that such a circuit will comprise complementary field effect means 38, 40, 42, and 44. Control input lead 46 connects a control signal to the gate of device 38 through an overload protective circuit 56 and such control signal is tapped to an inverter 48 whose inversion of the control signal is connected to the gate of device 44.

A data signal is fed via lead 50 and an overload protective circuit 52 to the gate of device 40 and the gate of device 42. This circuit is completed with an output lead 54 in the connection of devices 38 and 40 to device 42 that is also located so as to be in the connection of device 44 and 42 as well.

Control lead 46 is, with reference to FIG. 1, connected to the system control 20; whereas the data input is connected to one of the data lines 12, 14, 16 or 18, if there be more than one circuit involved in the buffer 28 or perhaps to all with multiplexing to sequentially operate with the data signal.

Figure 4:
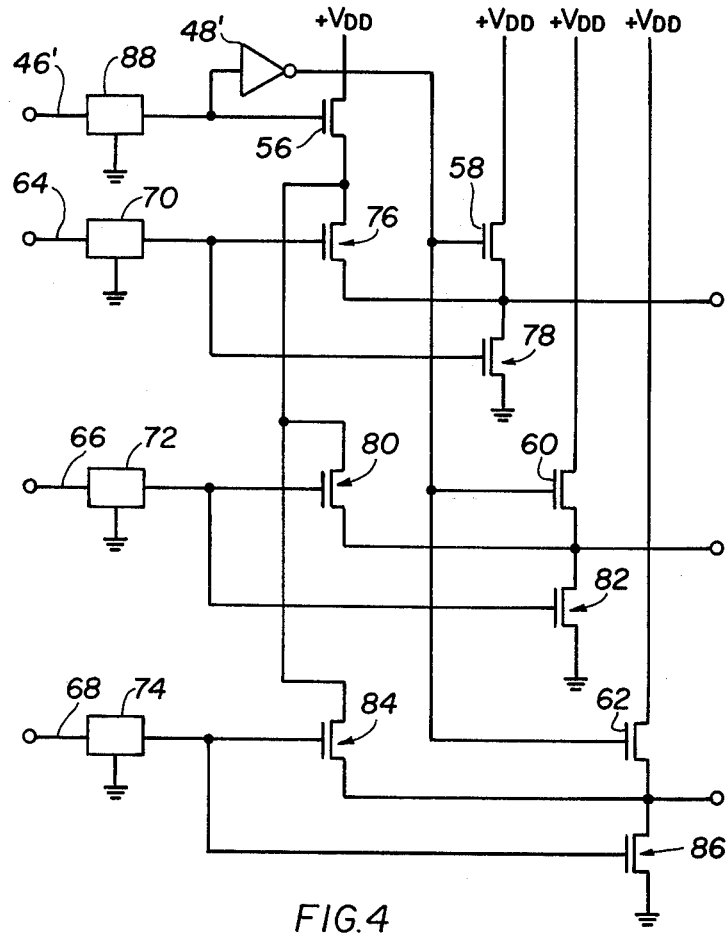
FIG. 4 is a schematic illustration of the circuit of unipolar devices for a mulitple output device in accordance with this invention.

With reference to FIG. 4 a multiple data device is shown having a control line 46' with an inverter 48' providing opposite binary signals to gate 56 than to gates 58, 60 and 62. A plurality of data inputs 64, 66 and 68 are fed via overload protective circuits 70, 72 and 74 to field effect devices 76, 78; 80, 82; and 84, 86. One skilled in the art will readily understand the operating of this circuit from the following description of the operation of the circuit of FIG. 3. If desired, such a person skilled in the art could readily understand how one could have a circuit using more than one control signal for mode control. Really all that is necessary is to switch one of several control inputs to lines 46 or 46', or to switch a logical combination of control inputs to lines 46 or 46'.

OPERATION

In operation with a low control signal (binary 0) and a high data signal (binary 1) device 38 is on so that the high data signal that biases 40 off and 42 on will provide an output signal at 54 characteristically inverted with respect to the data signal. With a low control signal and a low data signal, device 38 remains on so that the low data signal biases 40 on and 42 off provide an output signal at 54 characteristically inverted with respect to the data signal 50. In either said case, device 44 is biased off by the signal from inverter 48.

With a high control signal (binary 1) device 38 is off and device 44 by reason of inversion of such signal is on. Then a data signal that biases 42 on will again provide an output signal which will be an inversion of the data signal. Device 44 acts as a load resistance in this case, and must be properly designed with respect to device 42. With the control signal remaining high and high data signal, device 38 remains off and device 44 remains on. Device 42 off by reason of a low data signal, allows device 44 to provide an output signal which is the inversion of the data signal.

Having described an operative embodiment of this invention it is now desired to set forth the protection sought by these Letters Patent in the following claims:

1. A signal processing circuit controlling output voltage comprising:
    a series of field effect transistors including first and second such transistors of one conductivity type connected to a third such transistor of differing conductivity across a power source;
    a fourth field effect transistor connected between said third such transistor and the power source in parallel with said first and second such transistors;
    means to provide a control signal to said first field effect transistor and an inverted signal thereof to said fourth field effect transistor;
    means to provide a data signal to said third of such transistors and to the second field effect transistor; and
    means to provide an output of said circuit from the connection of said first and second such transistors to the power source from said fourth field effect transistor to said third field effect transistor.

2. The circuit of claim 1 and further comprising in said means to provide a data signal a protective circuit to prevent overloading of said third such transistor and the second field effect transistor.

3. An input buffer circuit comprising:
    a control signal circuit having a first field effect transistor receiving a control signal at its gate for controlling supply voltage therethrough and at least one second field effect transistor having its gate connected via an inverter to the aforesaid control signal for controlling supply voltage therethrough so as to be selectively operable by high and low control signals;
    data signal circuit having at least one third field effect transistor of a conductivity type the same as the first in the path of supply voltage from said first field effect transistor and at least one fourth field effect transistor in the path of supply voltage from said third and said second; and
    at least one output means in the path of said fourth field effect transistor means.

4. The circuit of claim 3 and further comprising multiple data signal circuits having a multiplicity of said third and fourth field effect transistors as well as a multiple of said second field effect transistors in said control signal circuit.

5. The input buffer circuit of claim 4 and further characterized by a means to connect said control signal circuit to said first field effect transistor and the complement thereof to each of the multiple of said second field effect transistors and a plurality of data signal circuit means for each one of the multiple of said third and fourth field effect transistors with a plurality of output means for selective data transfer by common control.

6. A circuit comprising:
    a first series circuit of field effect devices including first and second P type field effect transistors concluding with a third N type field effect transistor;
    a fourth P type field effect transistor connected to said third field effect transistor so as to be a parallel with the first and second field effect transistors connection with said third field effect transistor;
    means to provide a control signal to said first field effect transistor, said means also providing a complementary control signal to said fourth field effect transistor;
    data input means to control the gating of said second field effect transistor and said third field effect transistor; and
    means to derive output signals at the connection of the first and second field effect transistors and the fourth field effect transistor to the third field effect transistor.

7. The circuit of claim 6 and further comprising an overload protective circuit for the data input means.

* * * * *